United States Patent [19]
Arnoux et al.

[11] Patent Number: 4,704,575
[45] Date of Patent: Nov. 3, 1987

[54] HALL-EFFECT CURRENT CLAMP

[75] Inventors: Daniel Arnoux; Claude Genter; Christian Anton; Eric Nascimben, all of Paris, France

[73] Assignee: Societe Chauvin Arnoux, Paris, France

[21] Appl. No.: 850,529

[22] Filed: Apr. 11, 1986

[30] Foreign Application Priority Data

Jun. 28, 1985 [FR] France ............................ 85 09866

[51] Int. Cl.⁴ ............................................ G01R 19/00
[52] U.S. Cl. .................................................. 324/117 H
[58] Field of Search ................... 323/294, 364, 368; 324/117 R, 117 H, 127, 251; 340/664; 307/309; 338/32 H

[56] References Cited

U.S. PATENT DOCUMENTS 3,525,041  8/1970  Velsink ............................... 324/251
4,138,641  2/1979  Karlin et al. ...................... 324/123 R

OTHER PUBLICATIONS

"A Constant Power Hall-Probe Circuitry for Fast Field Mapping", by Szabits, 6th Int. Conf. on Mag. Tech., pp. 849–853, 9/77.
"S.A.S. 231, An Integrated Hall Effect Circuit with Analog Output" by Tachmann, Siemens AG Components Report, XIV (1979), #6, pp. 225–227.
"Monolithic Hall Cell System", by Bolash et al., IBM Tech. Disc. Bull., vol. 21, #7, 12/78, pp. 2717–2718.

Primary Examiner—Reinhard J. Eisenzopf
Assistant Examiner—W. Burns
Attorney, Agent, or Firm—Wolf, Greenfield & Sacks

[57] ABSTRACT

A Hall-effect current clamp, in which the constant-current generator (13) supplying the Hall-effect cell (8) comprises an operational amplifier (15) which has an internal-voltage reference (17) and which pilots a transistor (Q1) mounted in emitter follower in series with the cell (8), such that the current which traverses it is on the order of 1 mA. At the output of the measurement amplifier (14) of the clamp, a dividing bridge (P1,R5) whose intermediate lead is connected to the inverting (−) input of the amplifier (14) permits obtaining a supplementary amplification of the output signal of the clamp at the price of a low current consumption. Thus, the total current consumption of the clamp is maintained at a very low level, thereby providing a considerable increase in the life span of the batteries (9) used to supply the clamp.

8 Claims, 5 Drawing Figures

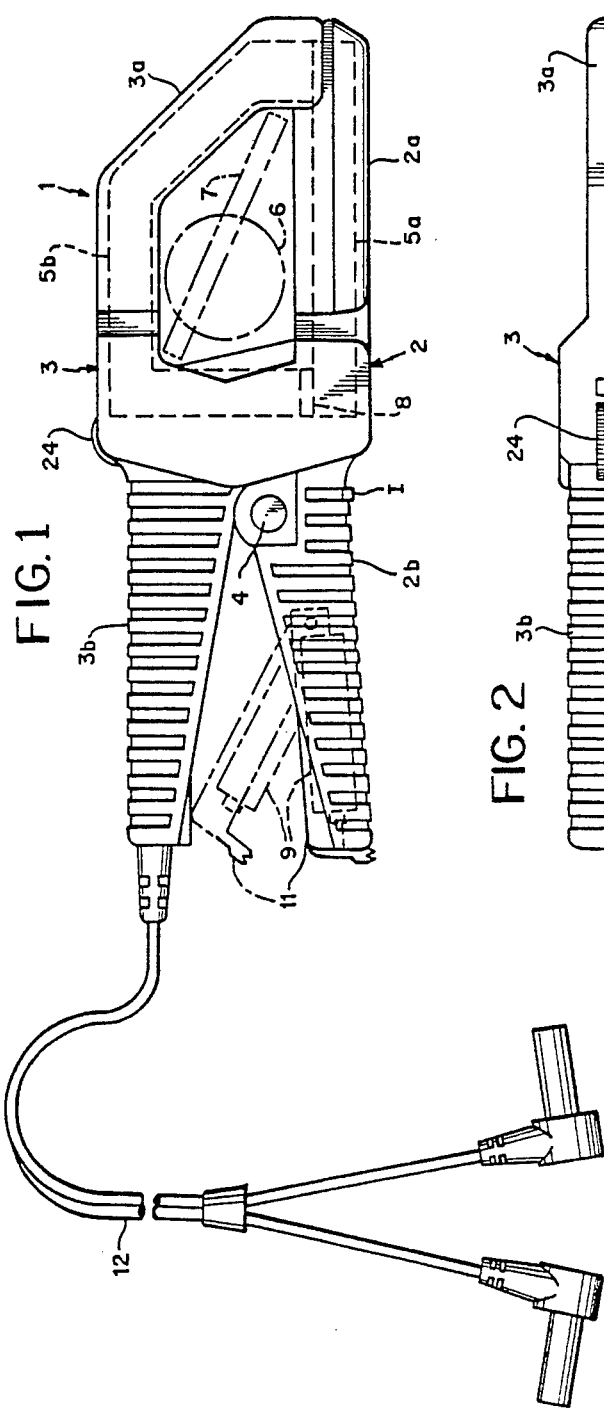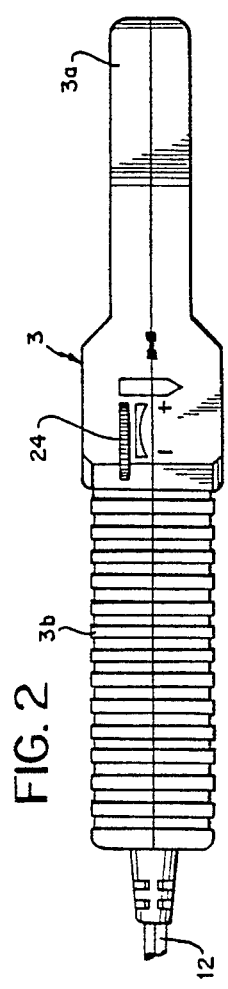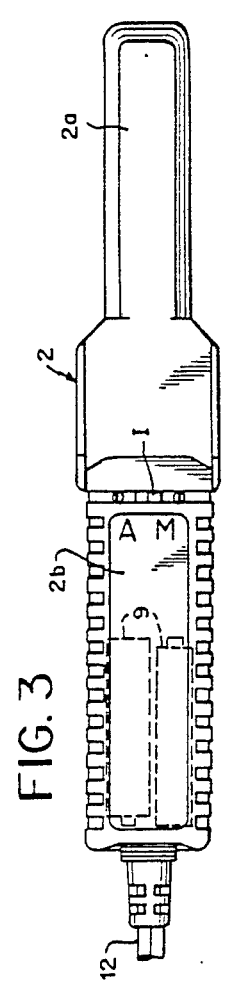

HALL-EFFECT CURRENT CLAMP

FIELD OF THE INVENTION

This invention relates to a Hall-effect current clamp, comprising a magnetic circuit consisting of two parts, which form a practically closed loop and which can be spread apart from each other, a constant-current generator, a Hall-effect cell placed in an air gap of the magnetic circuit and having two input terminals connected to the constant-current generator and two output terminals, and an operational amplifier for measurement having two inputs, inverting and non-inverting respectively, connected respectively to the output terminals of the Hall-effect cell by first and second resistances of the same ohmic values.

BACKGROUND OF THE INVENTION

Hall-effect current clamps are well known. Connected to a multimeter (millivoltmeter), to an oscilloscope or to a plotter, they permit measuring the strength of a direct or alternating current and/or visualizing the shape of the current. Such current clamps are marketed, for example, by the company Bell Inc., under the designation "Current Gun" Model CG 100 A, or by the Beckman Corporation under the designation "AC/DC Current Clamp" CT 233. These known clamps have a relatively high current consumption and, as a result, the batteries which are used to supply them with current have a relatively short life span. For instance, the Bell CG 100 A current clamp is supplied under 6 V (four 1.5 V Type AA batteries) and consumes about 40 mA, or a consumed power of 240 mW. The life span of the batteries is about 30 hours with alkaline batteries and about 60 hours with mercury batteries (data furnished by the manufacturer). The Beckman CT 233 current clamp is supplied under 9 V (one 9 V Type 6 LF 22 battery) and consumes about 15 mA (data furnished by the manufacturer), or a consumed power of about 135 mW. Inasmuch as the 9 v Type 6 LF 22 batteries have a capacity of about 500 mA.h the life span of the battery with the Beckman clamp is, therefore, about 30 hours.

Hence, the purpose of the present invention is to provide a current clamp having a current consumption noticeably less than that of the abovementioned known clamps and, consequently, permitting a greater autonomy of the batteries being used for its supply.

SUMMARY OF THE INVENTION

To this end, the current clamp of the present invention is characterized in that the constant-current generator comprises an operational amplifier having an inverting input and a non-inverting input connected to a first supply terminal which is a first potential, the said operational amplifier comprising an internal continuous-voltage reference placing its non-inverting input to a second fixed potential with respect to the first supply terminal, the second potential being greater than the first potential, and an npn transistor whose base is connected to the output of the said operational amplifier and whose emitter is connected on the one hand to the first supply terminal through a third resistance and on the other hand directly to the inverting input of the said operational amplifier, the collector of the npn transistor being connected to one of the two inputs of the Hall-effect cell whose other input is connected to a second supply terminal which is at a higher third potential than the second potential; and in that the operational amplifier for measurement is connected, for its current supply, to a third supply terminal which is at a fourth potential higher than the third potential, the non-inverting input and the output of the operational amplifier for measurement being connected to the second supply terminal respectively by a fourth resistance and by a first potentiometer, the wiper of the first potentiometer being connected to the inverting input of the measurement amplifier by a fifth resistance of same ohmic value as the fourth resistance, the output of the operational amplifier for measurement and a terminal connected to the second supply terminal forming the output of the current clamp.

BRIEF DESCRIPTION OF THE DRAWINGS

The invention will now be described by making reference to the attached drawings on which:

FIG. 1 is a lateral-elevation view of the current clamp of the present invention.

FIGS. 2 and 3 are upper and lower views respectively of the current clamp of FIG. 1.

DETAILED DESCRIPTION OF THE PREFERRED EMBODIMENT

Figure 4:
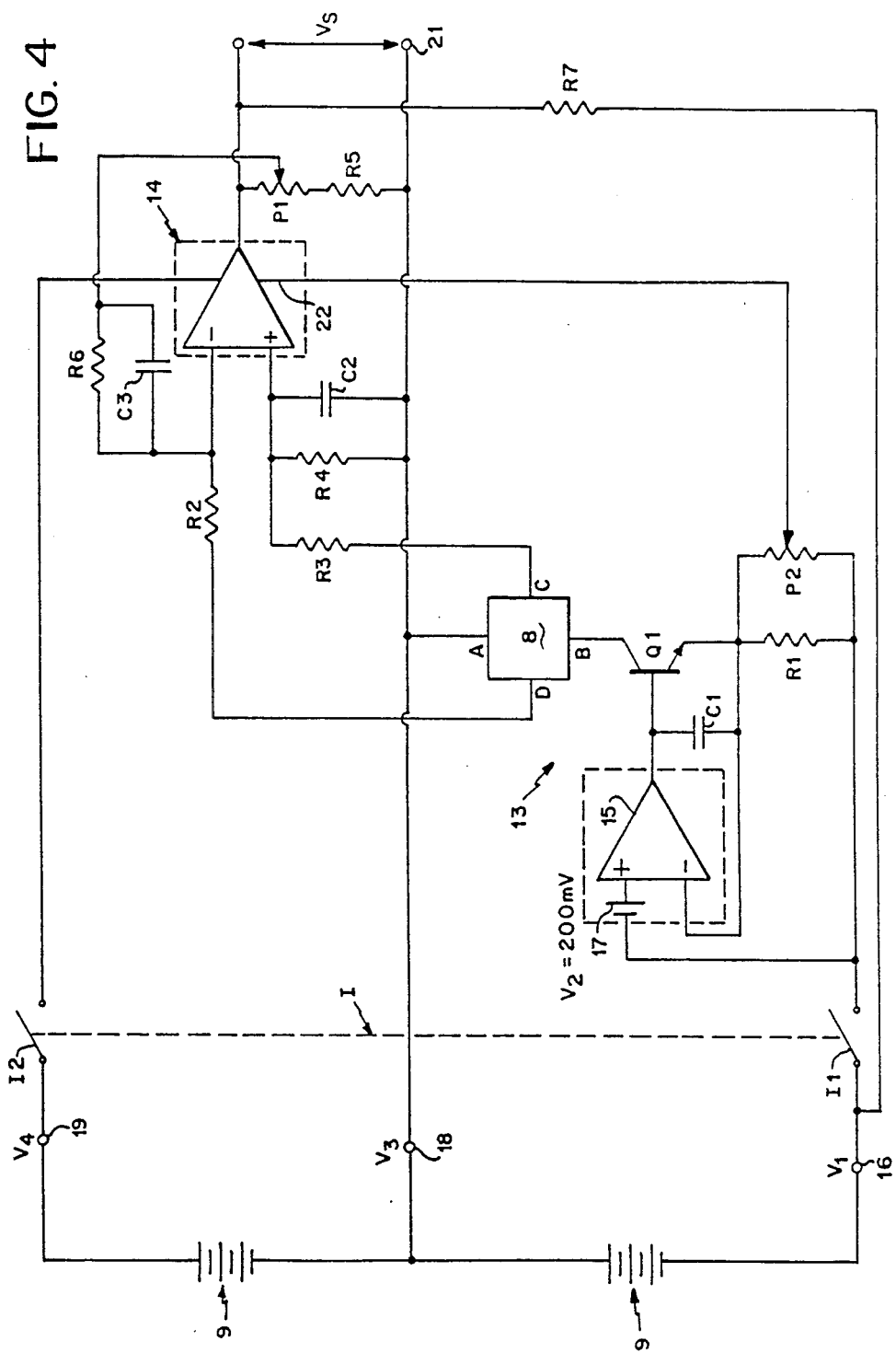
FIG. 4 is a diagram showing a first embodiment of the clamp circuits.

The current clamp shown in FIGS. 2 to 3 consists of a housing 1 made from two parts 2 and 3 of an insulating material, such as molded plastic. The two parts 2 and 3 are articulated with respect to each other by a shaft 4 in such a manner as to form a clamp having two jaws 2a and 3a and two handles 2b and 3b.

The clamp 1 comprises a magnetic circuit consisting of two parts 5a and 5b which are housed respectively in the jaws 2a and 3a of the clamp and which form a substantially closed loop when the clamp itself is closed. The jaws 2a and 3a of the clamp and the two parts 5a and 5b of the magnetic circuit are shaped in such a manner that a conductor of circular cross-section 6 or a conductor of rectangular cross-section 7, carrying a current to be measured, can be placed in the space formed between the jaws 2a and 3a.

A Hall-effect cell 8 is provided in an air gap between the two parts 5a and 5b of the magnetic circuit. The handle 2b of the clamp 1 is used as a housing for two supply batteries 9 which are accessible after opening a trap or cover 11. The handle 3b is used as a housing for a printed circuit board (not shown) on which are mounted the electrical and electronic components of the clamp. The board can be connected to a measurement or display device (multimeter, oscilloscope, plotter, etc.) by means of a cord 12.

In FIG. 4 is shown a first embodiment of the electrical circuits for the current clamp of the present invention, designed to measure only direct currents. In this first embodiment, the circuits of the clamp comprise essentially a constant-current generator 13, suitable for supplying a constant current to the Hall-effect cell 8, and an operational amplifier for measurement 14 operating as a differential amplifier. The constant-current generator 13 comprises an operational amplifier 15 whose non-inverting input (+) is connected to a supply terminal 16 through a first movable contact 11 of an on-off switch T (see also FIGS. 1 and 3). The operational amplifier 15 can, for example, consist of a part of an integrated circuit of the LM10 type which comprise an internal-voltage reference (shown diagrammatically in the form of a battery 17) which places the non-inverting input of the amplifier 15 at a fixed positive potential $V_2$ of 200 mV with respect to the potential $V_1$ of the supply terminal 16. The output of the amplifier 15 is connected on the one hand to its inverting input (−) through a capacitor C1 and on the other hand directly to the base of an npn transistor Q1. The emitter of the transistor Q1 is connected on the one hand directly to the inverting input of the amplifier 15 and on the other hand to the supply terminal 16 through a resistance R1 and through the abovementioned movable contact I1. The collector of the transistor Q1 is connected to an input B of Hall-effect cell 8 whose other input A is connected to a supply terminal 18 which is at a potential $V_3$ greater than the abovementioned potential $V_2$. For example, the potential difference $(V_3 - V_1)$ can be furnished by a 1.5 V battery.

The outputs D and C of the Hall-effect cell 8 are connected to the inverting input and to the non-inverting input of the measurement amplifier 14 through resistance R2 and R3 respectively, of same ohmic values. The amplifier 14 can consist of another part of the abovementioned integrated circuit, of type LM10, whose first part is used to form the amplifier 15. The non-inverting input of the amplifier 14 is connected to the supply terminal 18 through a resistance R4. The output of the amplifier 14 is connected to the terminal 18 through a potentiometer P1 and a resistance R5. The wiper of the potentiometer P1 is connected to the inverting input of the amplifier 14 through a resistance R6 of same ohmic value as the resistance R4. Capacitors C2 and C3 arranged in parallel with the resistances R4 and R6, respectively, are used to decrease the noise at the output of the amplifier 14. For its supply, the amplifier 14 is connected through a second movable contact I2 of the on-off switch I to another supply terminal 19 which is at a potential $V_4$ greater than the potential $V_3$. The potential difference $(V_4 - V_3)$ can be furnished by a second 1.5 V battery. The output of the amplifier 14 and a terminal 21 directly connected to the terminal 18 form the output of the current clamp which is connected by the supply cord 12 (FIG. 1), for example to a multimeter.

A potentiometer P2 is connected in parallel to the resistance R1. The wiper of the potentiometer P2 is connected to an input 22 of the amplifier 14. The potentiometer P2 is used to adjust the shift voltage of the amplifier 14 (this adjustment is performed at the factory).

The circuit described hereinabove operates in the following manner. With the moving contacts I1 and I2 closed, the non-inverting input of the amplifier 15 is at a fixed positive potential of 200 mV with respect to the terminal 16. The amplifier 15 pilots the transistor Q1 which is mounted in emitter follower. Hence, the voltage at the terminals of the resistance R1 is maintained at 200 mV. With a resistance $R_1$ of 200 ohms, the current which traverses the Hall-effect cell 8 is therefore maintained at a constant value on the order of 1 mA, neglecting the base current $I_B$ of the transistor Q1, which is about equal to 2 μA, and the derived current in the potentiometer P2, which is about equal to i 20 μA if the total resistance of the potentiometer P2 is 10 kΩ.

If the resistance R6 were connected to the output of the amplifier 14 instead of being connected to the wiper of the potentiometer P1, at the output of the current clamp there would be a voltage V (measured with respect to the potentiometer $V_3$ serving as reference for the voltage measurements):

$$V = \frac{R_6}{R_2}(V_C - V_D) \quad (1)$$

$V_C$ and $V_D$ being the voltages, measured with respect to to the potential $V_3$, at the output terminals C and D of the Hall-effect cell 8, and $R_2$ and $R_6$ being the ohmic values of the resistances R2 and R6. The ohmic values of the resistances R2, R3, R4 and R6 are selected as great as possible, on the one hand so that the amplifier 14 has a sufficient gain (R6/R2) and on the other hand so that the output of the Hall-effect cell 8 does not deliver too large a current which would then result in a non-linearity of the cell response.

However, in order to obtain a voltage $V_S$ of 1 mV per measured continuous ampere it is necessary to provide an adjustable supplementary amplification margin. This supplementary amplification is obtained by means of the dividing bridge formed by the potentiometer P1 and the resistance R5. In fact, by connecting the resistance R6 to the wiper of the potentiometer P1, a voltage $V_S$ is obtained at the output of the amplifier 14 such that:

$$V_s = \frac{(P_1 + R_5)V}{XP_1 + R_5} \quad (2)$$

In which V is given by the formula (1) indicated above, $P_1$ and $R_5$ represent the ohmic values of the potentiometer P1 and the resistance R5 respectively, and X is a coefficient included between 0 and 1, the product $X P_1$ representing the ohmic value of the fraction of the potentiometer P1 included between its wiper and its terminal connected to the resistance R5.

From formulas (1) and (2) above, the following formula (3) can be derived:

$$V_s = \frac{R_6}{R_2} \cdot \left(\frac{P_1 + R_5}{XP_1 + R_5}\right)(V_C - V_D) \quad (3)$$

The voltage difference $(V_C - V_D)$ being proportional to the strength of the current to be measured, the potentiometer P1 is adjusted in such a manner that, at the output of the current clamp, there is a continuous voltage $V_S$ of 1 mV per continuous ampere measured. This adjustment is performed at the factory.

A resistance R7 is placed between the output of the amplifier 14 and the supply terminal 16. The resistance R7 has a value which is selected in such a manner that, when the movable contacts I1 and I2 are open, the output of the current clamp exhibits a voltage having a predetermined value when the batteries 9 are discharged, for example 100 mV when $(V_3 - V_1) = IV$. This permits testing the supply voltage (to indicate, for example, if it is necessary to change the batteries) by connecting the current clamp to a multimeter while the movable contacts I1 and I2 are open.

To illustrate, for a DC 10 A/500 A current clamp the electrical and electronic components of FIG. 4 can be the following:

R1: resistance 200Ω
R2: resistance 59 kΩ
R3: resistance 59 kΩ

R4: resistance 1 MΩ
R5: resistance 4 kΩ
R6: resistance 1 MΩ
R7: resistance 136 kΩ
P1: potentiometer 10 turns, 10 kΩ
P2: potentiometer 10 turns, 10 kΩ
C1: capacitor 1 nF
C2: capacitor 22 pF
C3: capacitor 22 pF
Q1: npn BC 238 C transistor
14 and 15: LM 10 linear amplifier
8: VHG 320 (RANK 1) cell, Japan Victor Co.

With the components indicated above and with two 1.5 V batteries connected in series, one of the two batteries being connected between the terminals 16 and 18, and the other between terminals 18 and 19, the current absorbed in service by the current clamp is on the order of 1.5 mA, or a consumed power of 4.5 mW. With two Type AAA alkaline batteries which have a capacity of about 800 mA.h, the life span of the batteries is about 530 h. It will be noted that the current clamp of the present invention permits a considerable increase in the life span of the batteries as compared to previously known current clamps referred to above, while at the same time permitting the use of batteries having smaller dimensions, thus permitting a reduction in the dimensions and the weight of the current clamp. It will be noted that if two Type AA batteries of 1.5 V are used, which usually have a capacity of 1800 mA.h, in lieu of two Type AAA batteries, the life span of the batteries would then be about 1200 hours.

Figure 5:
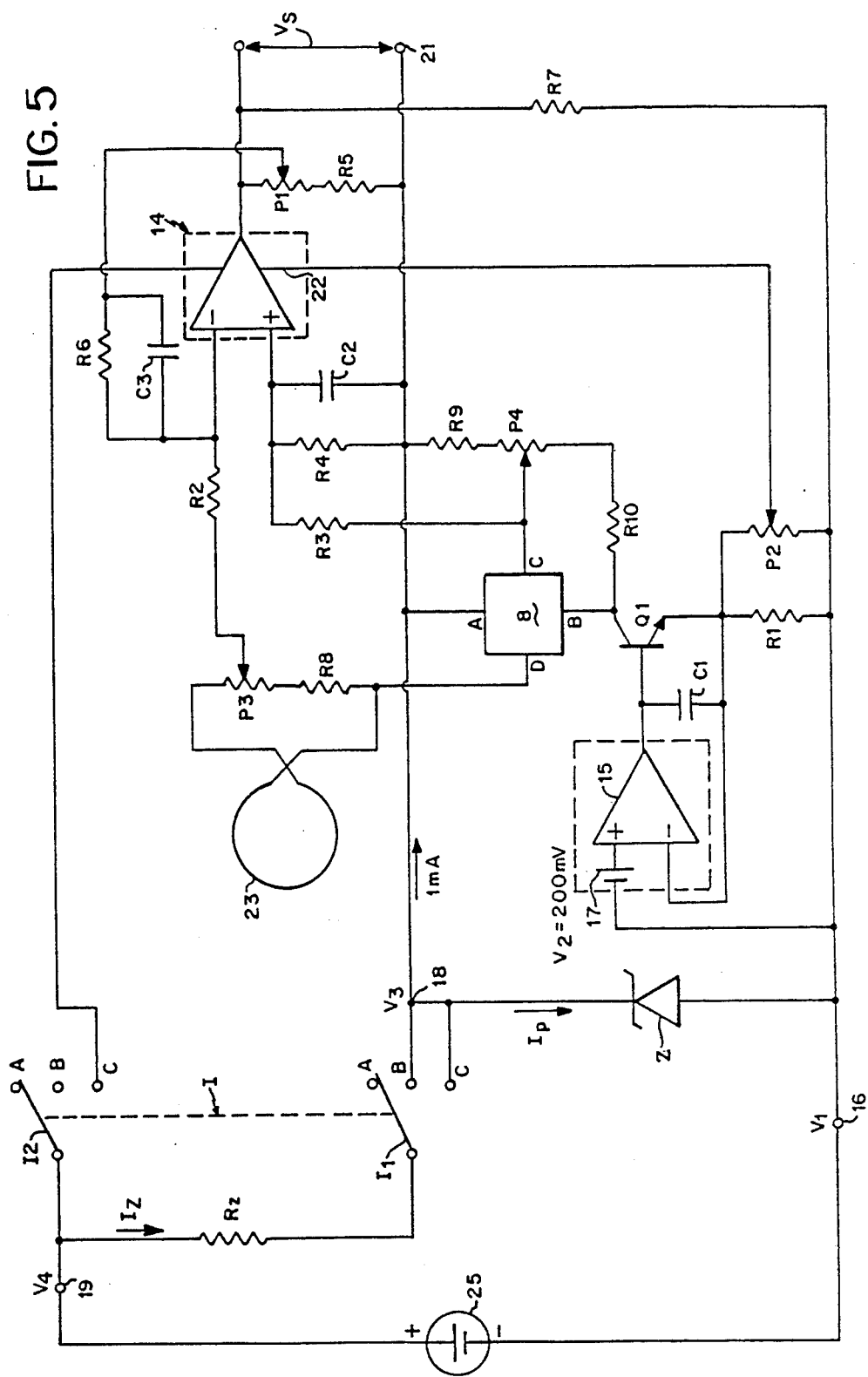
FIG. 5 is a diagram showing a second embodiment of the clamp circuits.

FIG. 5 shows another embodiment of the circuits of the current clamp to permit measuring not only direct currents, but also alternating currents. A great number of components of the circuit in FIG. 5 are identical to those of FIG. 4 and hence will not be described again in detail here. The circuit of FIG. 5 differs from that of FIG. 4 in that the output terminal D of the Hall-effect cell 8 is connected on the one hand to one of the ends of a potentiometer P3 through a resistance R8 and on the other hand to one of the ends of a coil 23 which surrounds the core of the magnetic circuit 5a, 5b (FIG. 1). The other end of the coil 23 is connected to the other end of the potentiometer P3 whose wiper is connected to the inverting input of the amplifier 14 through the resistance R2. The coil 23 and the potentiometer P3 form a compensation circuit. As a matter of fact, the coil 23 provides at its terminals, by induction, a voltage whose value is a function of the measured current and the frequency of this current (in direct, its influence is null). By the resistance R8 and the potentiometer P3, an adequate proportion of this voltage is added to the ($V_C - V_D$) in order to obtain a correct response in frequency to about 500 Hz. The adjustment of the potentiometer P3 is performed at the factory.

The output C of the Hall-effect cell 8 is connected to the wiper of a potentiometer P4 whose ends are connected to the supply terminal 18 and to the collector of the transistor Q1 respectively by resistances R9 and R10. The potentiometer P4 and the resistances R9 and R10 form a zero adjustment circuit. As a matter of fact, after the measurement of a strong direct current the residual magnetism of the plates in the magnetic circuit produces a voltage that must be annulled prior to proceeding to a new measurement. This can be effected by means of the potentiometer P4 whose wiper can be manipulated by using a serrated roller 24 which projects toward the exterior through a slot provided in the upper face of part 3 of the current-clamp housing 1 (FIGS. 1 and 2).

To illustrate, for an AC/DC 1 A/500 A current clamp the components of the circuit in FIG. 5 previously described in conjunction with FIG. 4 can be identical to those which have already been indicated above. The resistances R8, R9, R10 and the potentiometers P3 and P4 can have the following values:

R8: resistance 68Ω
R9: resistance 12 kΩ
R10: resistance 12 kΩ
P3: potentiometer 1 turn, 470Ω
P4: potentiometer 1 turn, 1 kΩ

As for the circuit of FIG. 4, the supply voltage for the circuit of FIG. 5 can for example be furnished by two 1.5 V batteries. However, FIG. 5 shows another manner for furnishing the supply voltage required for the operation of the circuit in FIG. 5 (or that of FIG. 4). The supply circuit shown in FIG. 5 includes a source of continuous voltage 25, which can for example consist of one or several batteries, and whose negative terminal is connected to the terminal 16, whereas its positive terminal is connected to the terminal 19. The bipolar on-off switch I now includes three positions A, B, C corresponding respectively to the functions "Off", "Control of Supply Voltage" and "On". A resistance Rz is connected between the positive terminal of the source 25 and the terminal 18 by means of the movable contact I1 when the latter is placed in position B. A zener diode Z is connected between the terminal 18 and the terminal 16. The ohmic value of the resistance Rz must be selected in such a fashion that:

$$I_z = I_p + 1 \text{ mA}$$

$$R_z I_z = V_O - V_z$$

In the above formulas, $I_z$ designates the current traversing the resistance $R_z$, $I_p$ the polarization current of the zener diode, $V_O$ the continuous voltage furnished by the source 25, and $V_z$ the zener voltage of the zener diode. In order to provide proper operation of the integrated circuit LM10 forming the amplifiers 14 and 15, it is necessary that the voltage $V_O$, that is to say the difference of potential $V_4 - V_1$, be situated between 2 V and 40 V, and that the difference of potential $V_3 - V_1$, hence the zener voltage $V_z$, be situated between 1 V and 20 V.

In the case where the voltage source 25 consists of one or several batteries, the supply circuit shown in FIG. 5 is, however, less advantageous than that of FIG. 4 where only two batteries are used. In fact, it requires two additional components (the resistance $R_z$ and the zener diode) and it entails an additional consumption of current (the polarization current $I_p$ of the zener diode).

It goes without saying that the embodiments of the present invention which have been described above have been given solely for illustration purposes and are by no means restrictive, and that numerous modifications can be easily provided by the skilled person without departing from the framework of the present invention. For example, although FIGS. 1 and 3 show the batteries incorporated into the current clamp 1, the voltage required for the operation of the said clamp could be furnished by an outside source, such as cells or batteries housed in the multimeter associated with the clamp. In this case, the cord 12 should include, in addition to the two conductors connected to the output of the current clamp, two or three supplementary conductors furnishing the potentials $V_1$, $V_3$ and $V_4$.

We claim:

1. A Hall-effect current clamp comprising a magnetic circuit consisting of two parts (5a and 5b) which form a substantially closed loop and which can be spread apart from each other, a constant-current generator (13), a Hall-effect cell (8) placed in an air gap of the magnetic circuit and having two input terminals (A and B) connected to the constant-current generator and two output terminals (C and D), and an operational amplifier for measurement (14) having an output and having two inputs, inverting and non-inverting respectively, connected respectively to the output terminals of the Hall-effect cell by first and second resistances (R3 and R2) of the same ohmic value, characterized in that the constant-current generator (13) comprises an operational amplifier (15) having an output, an inverting input and a non-inverting input connected to a first supply terminal (16) which is at a first potential ($V_1$), said operational amplifier comprising an internal continuous-voltage reference (17) placing its non-inverting input to a second fixed potential ($V_2$) greater than the first potential ($V_1$), and an npn transistor (Q1) whose base is connected to the output of said operational amplifier (15) and whose emitter is connected on the one hand to the first supply terminal (16) through a third resistance (R1) and on the other hand directly to the inverting input of said operational amplifier (15), a collector of the npn transistor (Q1) being connected to one input (B) of the two inputs of the Hall-effect cell (8) whose other input (A) is connected to a second supply terminal (18) which is at a third potential ($V_3$) higher than the second potential ($V_2$), and in that the operational amplifier for measurement (14) is connected, for its direct current supply, to a third supply terminal (19) which is at a fourth potential ($V_4$) higher than the third potential ($V_3$), the non-inverting input and the output of the operational amplifier for measurement (14) being connected to the second supply terminal (18) respectively by a fourth resistance (R4) and by a first potentiometer (P1), a wiper of the first potentiometer being connected to the inverting input of the measurement amplifier (14) by a fifth resistance (R6) of same ohmic value as the fourth resistance (R4), the output of the operational amplifier for measurement (14) and a terminal (21) connected to the second supply terminal (18) forming an output of the current clamp.

2. A current clamp according to claim 1, characterized in that a second potentiometer (P2) is connected in parallel with a third resistance (R1), a wiper of the second potentiometer (P2) being connected to an input (22) used to adjust a shift voltage of the operational amplifier for measurement (14).

3. A current clamp according to claim 1 or 2, characterized in that it comprises an on-off switch (I) having two movable contacts ($I_1$ and $I_2$) mechanically coupled and connected in series with the first and third supply terminals (16 and 19) respectively, and in that the output of the operational amplifier for measurement (14) is connected by a sixth resistance (R7) to the first supply terminal (16), ahead of the movable contact ($I_1$) of the on-off switch (I), the sixth resistance (R7) having a value selected such that the output voltage of the current clamp has a predetermined value when the on-off switch (I) is open and batteries (9) connected to the three supply terminals (16, 18 and 19) are exhausted.

4. A current clamp according to claim 1 or 2 characterized in that the output terminal (D) of the Hall-effect cell (8) which is connected to the inverting input of the operational amplifier for measurement (14), is connected on the one hand to one of the ends of a third potentiometer (P3) through a seventh resistance (R8) and on the other hand to one of the ends of a coil (23) which surrounds the magnetic circuit (5a,5b) and whose other end is connected to the other end of the third potentiometer (P3), the wiper of the third potentiometer (P3) being connected to the inverting input of the measurement amplifier (14) through the first resistance (R2).

5. A current clamp according to claim 1 or 2 characterized in that the output (C) of the Hall-effect cell which is connected to the non-inverting input of the measurement amplifier (14) is also connected to a wiper of a fourth potentiometer (P4) whose ends are connected to the second supply terminal (18) and to the collector of the npn transistor (Q1) respectively by eighth and ninth resistances (R9 and R10).

6. A current clamp according to claim 3 characterized in that the output terminal (D) of the Hall-effect cell (8) which is connected to the inverting input of the operational amplifier for measurement (14), is connected on the one hand to one of the ends of a third potentiometer (P3) through a seventh resistance (R8) and on the other hand to one of the ends of a coil (23) which surrounds the magnetic circuit (5a, 5b) and whose other end is connected to the other end of the third potentiometer (P3), the wiper of the third potentiometer (P3) being connected to the inverting input of the measurement amplifier (14) through the first resistance (R2).

7. A current clamp according to claim 3 characterized in that the output (C) of the Hall-effect cell which is connected to the non-inverting input of the measurement amplifier (14) is also connected to a wiper of a fourth potentiometer (P4) whose ends are connected to the second supply terminal (18) and to the collector of the npn transistor (Q1) respectively by eighth and ninth resistances (R9 and R10).

8. A current clamp according to claim 4 characterized in that the output (C) of the Hall-effect cell which is connected to the non-inverting input of the measurement amplifier (14) is also connected to a wiper of a fourth potentiometer (P4) whose ends are connected to the second supply terminal (18) and to the collector of the npn transistor (Q1) respectively by eighth and ninth resistances (R9 and R10).

* * * * *